United States Patent [19]

Sepponen

[11] Patent Number: 4,906,931
[45] Date of Patent: Mar. 6, 1990

[54] APPARATUS AND METHOD FOR THE EXAMINATION OF PROPERTIES OF AN OBJECT

[75] Inventor: Raimo Sepponen, Helsinki, Finland

[73] Assignee: Instrumentarium Corp., Finland

[21] Appl. No.: 255,233

[22] Filed: Oct. 11, 1988

[30] Foreign Application Priority Data

Oct. 8, 1987 [FI] Finland .................................. 874419

[51] Int. Cl.⁴ ........................................... G01R 33/20
[52] U.S. Cl. .................................................. 324/309
[58] Field of Search ............... 324/300, 307, 309, 318, 324/319, 320, 322; 128/653

[56] References Cited

U.S. PATENT DOCUMENTS 3,774,103 11/1973 Laukien ................................ 324/307
4,587,488 5/1986 Young ................................... 324/309

FOREIGN PATENT DOCUMENTS 1461077 11/1973 United Kingdom .

Primary Examiner—Michael J. Tokar
Attorney, Agent, or Firm—Andrus, Sceales, Starke & Sawall

[57] ABSTRACT

The invention relates to an apparatus for the examination of an object by the application of methods, such as magnetic imaging, based on nuclear magnetic resonance. The apparatus includes means for creating a first magnetic field over an object to be examined as well as means for creating and registering a nuclear magnetic resonance signal. The apparatus further includes means for creating a second magnetic field in a manner that the formation of nuclear magnetization occurring between successive excitation and signal pick-up events is at least partially effected while the second magnetic field is switched on.

14 Claims, 5 Drawing Sheets

APPARATUS AND METHOD FOR THE EXAMINATION OF PROPERTIES OF AN OBJECT

The present invention relates to an apparatus for and a method of improving the signal-to-noise ratio of tests based on nuclear magnetic resonance when examining properties of an object.

Ever since the 1950s, nuclear magnetic resonance phenomenon, has been an important method for examining matter. Magnetic imaging (is one application of nucleor magnetic resonance. Magnetic imaging previously also called nuclear spin imaging) is a novel non-destructive examination method, one of the most important applications of which is medical diagnostics. The principle of magnetic imaging was introduced by P. Lauterbur in 1973 (Lauterbur: Nature vol. 242, Mar. 16, 1973). Prior to this, R. Damadian had disclosed an operating idea for a sort of examination apparatus based on NMR (Nuclear Magnetic Resonance) phenomenon (Damadian: U.S. Pat. No. 3 789 832). A plurality of magnetic imaging methods or examination methods based on NMR have been developed and described in references: Ernst: U.S. Pat. No. 4 070 611, Garroway et al: U.S. Pat. No. 4 021 726, Moore edt al: U.S. Pat. No. 4 015 196.

Magnetic imaging, the same as other NMR examination methods, is based on the fact that the nuclei of certain elements have a magnetic moment. Such elements include e.g. hydrogen, carbon, sodium, potassium, phosphor and fluorine. NMR phenomenon has been described in several references: Abragam: The principles of nuclear magnetism, Oxford, Clarendon Press 1961, Dixon et al: Med. Phys. vol. 9, pp. 807–818, 1982, Farrar et al: Pulse and Fourier transform NMR, New York, Academic Press, 1971, Michel: Grundlagen und Methoden der kernmagnetischen Resonanz, Berlin, Akademie-Verlag, 1981 and Slichter: Principles of magnetic resonance, Berlin, Springer Verlag, 1980.

Magnetic imaging has also been explained in several references: Battocletti: CRC Cit. Rev. Biomed. Eng., vol. 11, pp. 313–361, 1984, Bottomley: Rev. Sci. Instrum., vol. 53, pp. 1319–1137, 1982, Hinshaw et al: Proc IEEE, vol. 71, pp. 338–350, 1983 and Mansfield et al: NMR imaging in biomedicine. Waugh, J S (ed), Advances in magnetic resonance, New York, Academic Press, 1982.

It is well-known that a signal-to-noise ratio obtainable in NMR tests depends on the intensity of a polarizing magnetic field (Bo). Theoretically, the signal-to-noise ratio is proportional to the square of a magnetic field. In practice, electrical dissipations created in a signal coil and in an object to be examined decrease dependence. Thus, for example, the signal-to-noise ratio in imaging a human body is directly proportional to the intensity of Bo. The increase of an artifact created by the absolute inhomogeneity of a magnetic field and so-called chemical transition may diminish the dependence of a signal-to-noise ratio to the square or cubic root of Bo. The above viewpoints have been described e.g. in the following references: Hoult et al: J. Magn. Reson., vol. 34, pp. 425–433, 1979 and Hoult et al: Proc. 3rd Annual Meeting of Soc. Magn. Reson. in Medicine, August 13–17, New York, USA, 1984, pp. 148–152. The effect of the bandwidth of a signal coil and a signal on the signal-to-noise ratio and certain technical solutions associated therewith have been dealt with e.g. in references: Sepponen: U.S. Pat. No. 4 587 493 and U.S. Pat. No. 4 626 784.

Increasing the intensity of a polarizing magnetic field (Bo) is the most straightforward way of increasing the signal-to-noise ratio of magnetic images. However, increasing the magnetic field incurs substantial costs and installation of the apparatus in a hospital environment becomes more difficult. In addition, operating costs rise quickly as the intensity of a magnetic field increases. Operational safety of the apparatus deteriorates as the intensity of a magnetic field increases: The magnetic field produces forces in ferromagnetic objects and excitation of the nuclear magnetization of an object requires the use of increased powers which also, due to increased frequency, are absorbed more effectively in an object to be examined. The above viewpoints exclude some of the patients and also some of the applicable pulse sequences. Such a pulse sequence is e.g. a method intended for imaging relaxation time Tlrho and described in references: Sepponen: FI Patent application 842292 and FI Patent application 844561. The tissue characterization and tissue differentation methods applicable in medical imaging have been dealt with e.g. in reference Sepponen: Acta Polytechnica Scandinavica, vol. EL 56, 44p., 1986.

An arrangement of the invention is capable of achieving a significant improvement to the signal-to-noise ratio of magnetic images without having to increase the intensity of a homogeneous magnetic field Bo applied to the object.

Objects of the invention are accomplished by what is set forth in more detail in claim 1 and in the subclaims. An arrangement of the invention can be used to increase the signal-to-noise ratio in tests based on nuclear magnetic resonance without having to boost a magnetic field Bo existing during the observation of a resonance signal.

The operating principle and a few practical embodiments of the invention are illustrated in the accompanying drawings, in which FIG. 1 shows a magnetic imaging apparatus, wherein a homogeneous and constant-intensity polarizing magnetic field Bo is produced by a magnet 20 to which is connected a power source 22. A magnetic coil BC produces over the object a second polarizing magnetic field Bp. In current required by magnetic coil 24 is supplied by a power source 26 controlled by a central processor 28. Location information is coded in a nuclear magnetic signal by gradient coils 30 to which are connected sets of power sources 32 controlled by central processor 28. The nuclear magnetic resonance signal is received by means of a signal coil SC which is connected via a coupler 36 to a signal amplifier 38 coupled with a phase-sensitive detector 40, the quadrature components of a signal obtained therefrom being transmitted via analog to digital converters 421 to central processor 28 which uses the stored signals to produce an image of e.g. the nuclear density of an object shown on a display 44 and stored in a memory unit 46. The excitation of nuclear magnetization is effected by a transmitter unit 48 which is controlled by central producessor 28. The excitation pulse is passed via coupler 36 to signal coil 34.

FIG. 2 shows a pulse sequence of one possible mode of operation for the apparatus, wherein BC represents the times at which a magnetic field Bp is switched on, RF represents the times at which the object is supplied with excitation pulses, Gx, Gy, Gz represent the times at which different gradient fields are switched on and D represents the times at which nuclear magnetic resonance signal is stored.

FIG. 3 illustrates the formation of nuclear magnetization at various phases of an operating cycle. When a magnetic field Bp is switched on, the nuclear magnetization relaxes towards a value Mn(Bo+Bp) which corresponds to a resultant field Bo+Bp (Bo, Bp, Mn are vector quantities). When magnetic field Bp is not switched on, the nuclear magnetization relaxes towards a value $M_n$(Bo) determined by magnetic field Bo.

FIG. 4 shows a so-called Inversion recovery sequence for mapping the longitudinal relaxation processes of nuclear magnetization.

FIG. 5 shows one possible apparatus for imaging the head. The signal coil SC can be a so-called saddle coil or two quadrature-connected saddle coils or a set of signal coils as described in reference Savolainen. The set of coils BC producing magnetic field Bp can be a so-called Helm-holz coil or a solenoid, coil; the coils of these two sets are parallel to each other.

Figure 2:
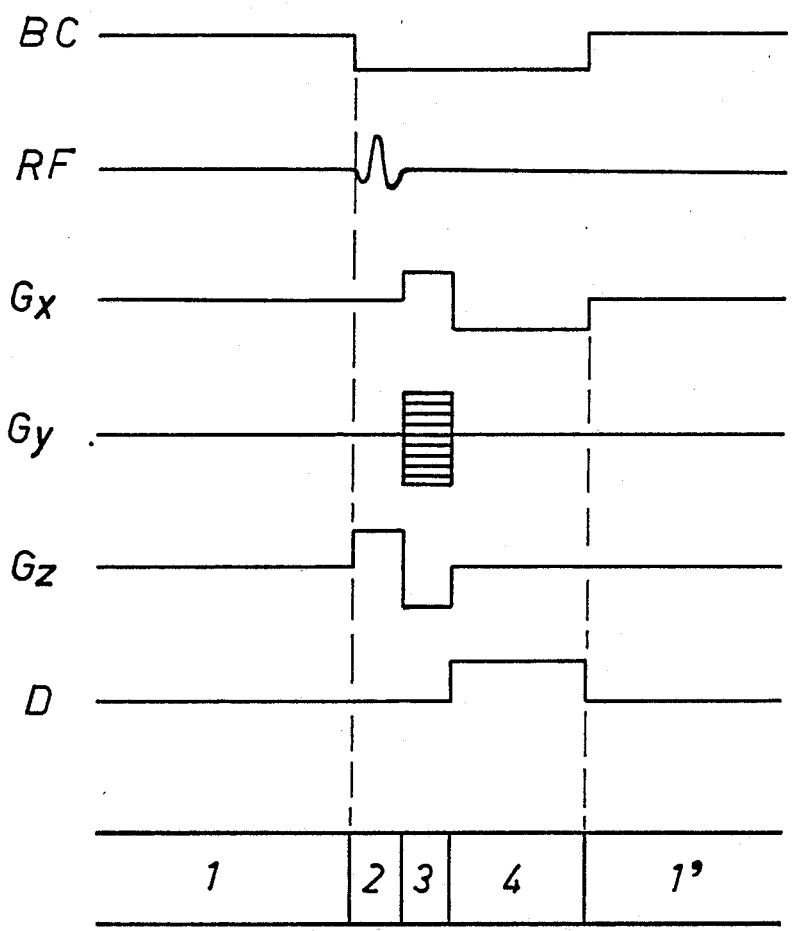
Figure 3:
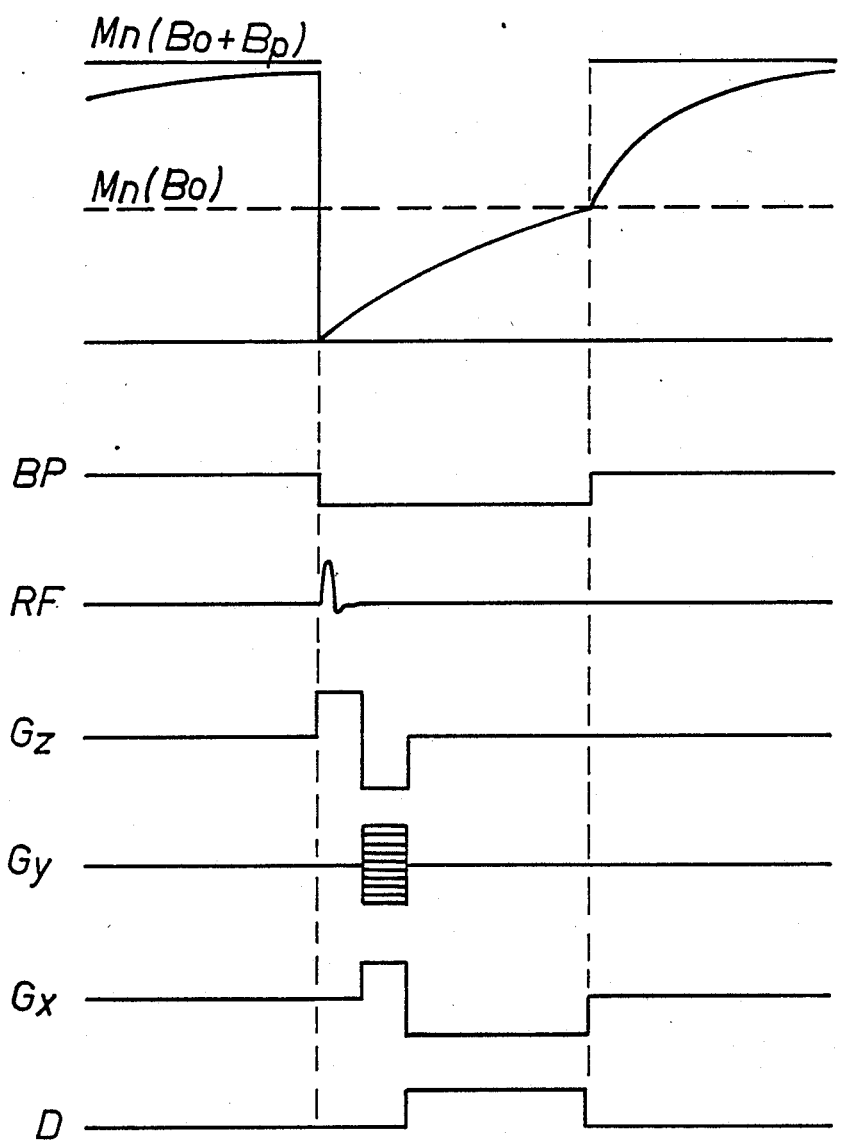
Figure 8:
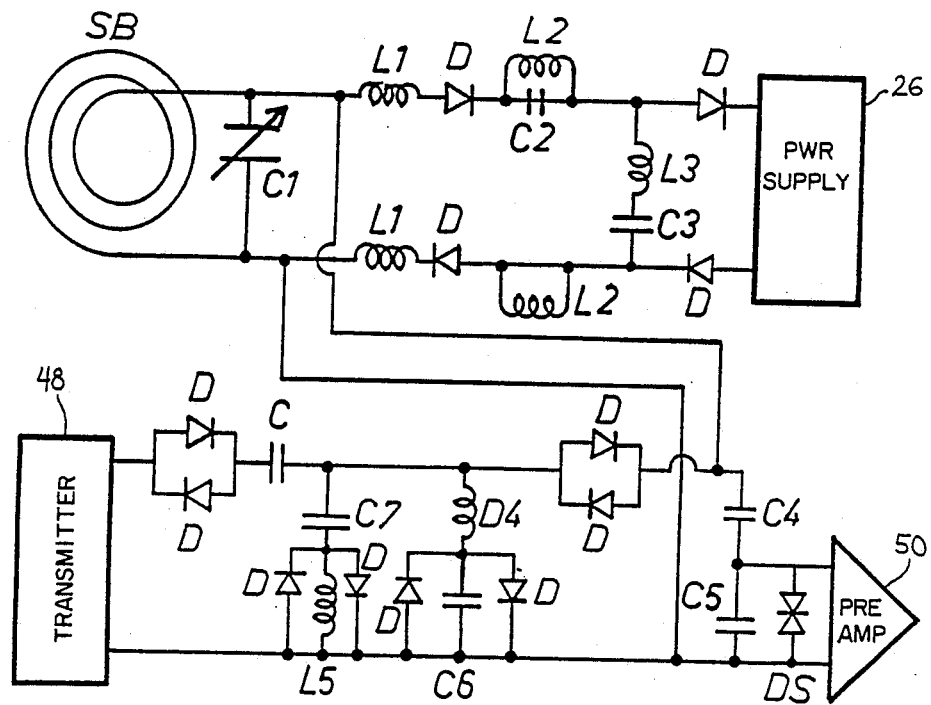

FIG. 8 shows a circuitry, wherein coil SB serves as the generator of magnetic field Bp, as the transmitter of an excitation pulse, and as the receiver of a resonance signal. In the circuitry, coils L1-L5 as well as capacitors C2, C3, C6 and C7 produce blocking circuits, whose switching is controlled by diodes D. A control capacitor C1 produces, with coil SB, a resonance circuit which, by means of capacitors C4 and C5, is applied to a preamplified 50 whose input is protected by a diode couple DS As illustrated in the above figures, an apparatus of the invention for the examination of nuclear magnetic resonance phenomenon includes equipment for generating a polarizing magnetic field Bo. The increase of a signal-to-noise ratio is based on the fact that nuclear magnetization is allowed to form (to relax) for at least part of the duration of an operating cycle in the resultant field of magnetic fields Bo and Bp. The duration of an operating cycle is TR, corresponding e.g. to a span between the successive phases 2 shown in FIG. 2, and magnetic field Bp is switched on during phase 1. Thus, a signal that is attained will be $$S = Mn(Bo+Bp)(1-\exp(TR/T1))\exp(-TE/T2) \quad (1)$$

wherein S=signal Mn(Bo+Bp) is an equilibrium magnetization corresponding to resulting magnetic field Bo+Bp
TR=repetition span
TE=time delay from excitation to spin echo pick-up, echo delay
T1=longitudinal relaxation time of an object
T2=transverse relaxation time of an object
Equation 1 applies provided that the time used for excitation, signal pick-up and phase coding (phases 2, 3 and 4 in FIG. 2) is significantly shorter than the time span TR between successive excitations. The formation of magnetization under the influence of magnetic fields is depicted in FIG. 3.

Figure 4:
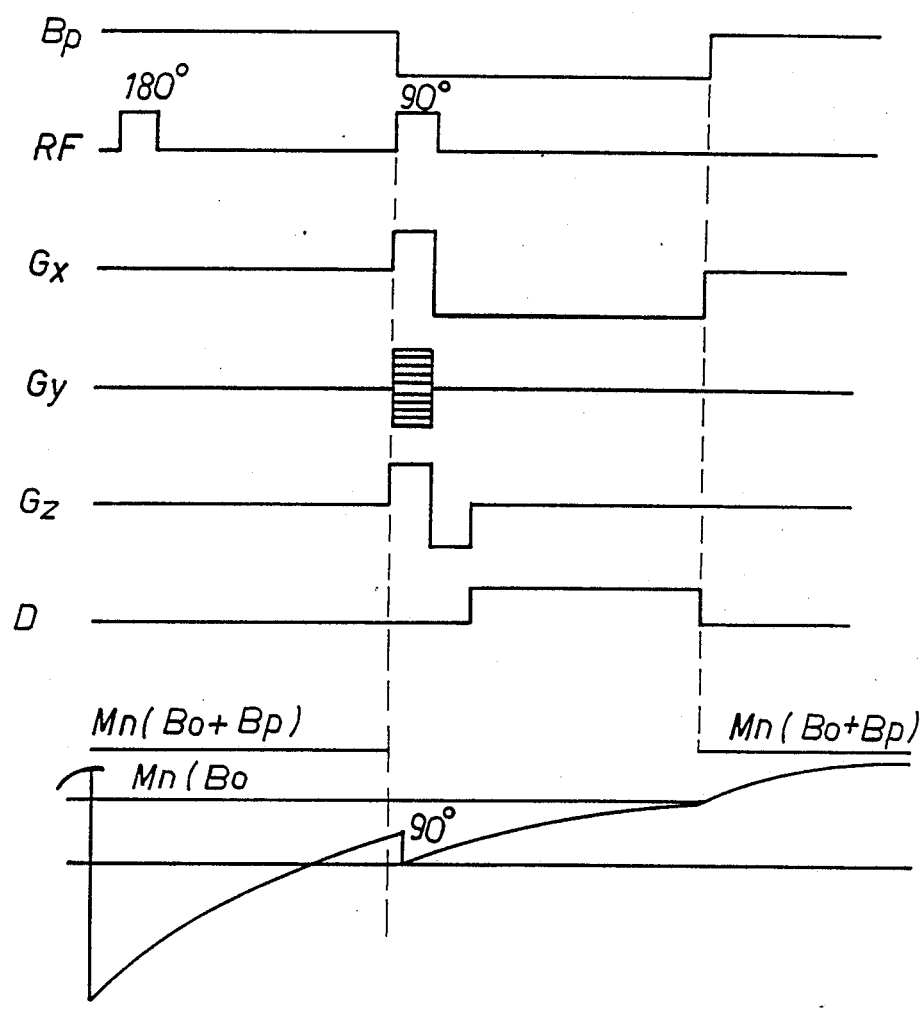

If a special purpose is to examine the longitudinal relaxation time distribution of an object, it is possible to apply a so-called Inversion Recovery sequence illustrated in FIG. 4. The formation of nuclear magnetization between a signal pick-up and the following 180° excitation pulse may proceed in a manner that the nuclear magnetization produced is as high as possible. During the time between the reversal of magnetization and the excitation of nuclear magnetization (time between 180° and 90°) a magnetic field Bp can be selected so that the relaxation occurs in a desired field. For example, by selecting the direction of Bp to be the same as that of Bo the signal-to-noise ratio of an image is maximized and the relaxation time corresponds to that of an object to be examined in field Bo+Bp. If the purpose is to examine the field dependence of relaxation events, the direction of Bp can be selected e.g. to be opposite to that of Bo, whereby the relaxation occurs in a smaller field Bo−Bp. Thus, it is possible to map the field dependence of longitudinal relaxation time, which may be beneficial e.g. in medical imaging as a tissue characterization parameter. The field dependence of the relaxation time of biological tissues is described e.g. in reference Koenig et al: Invest. Radiol. Vol. 19, p. 76-81, 1982.

Figure 1:
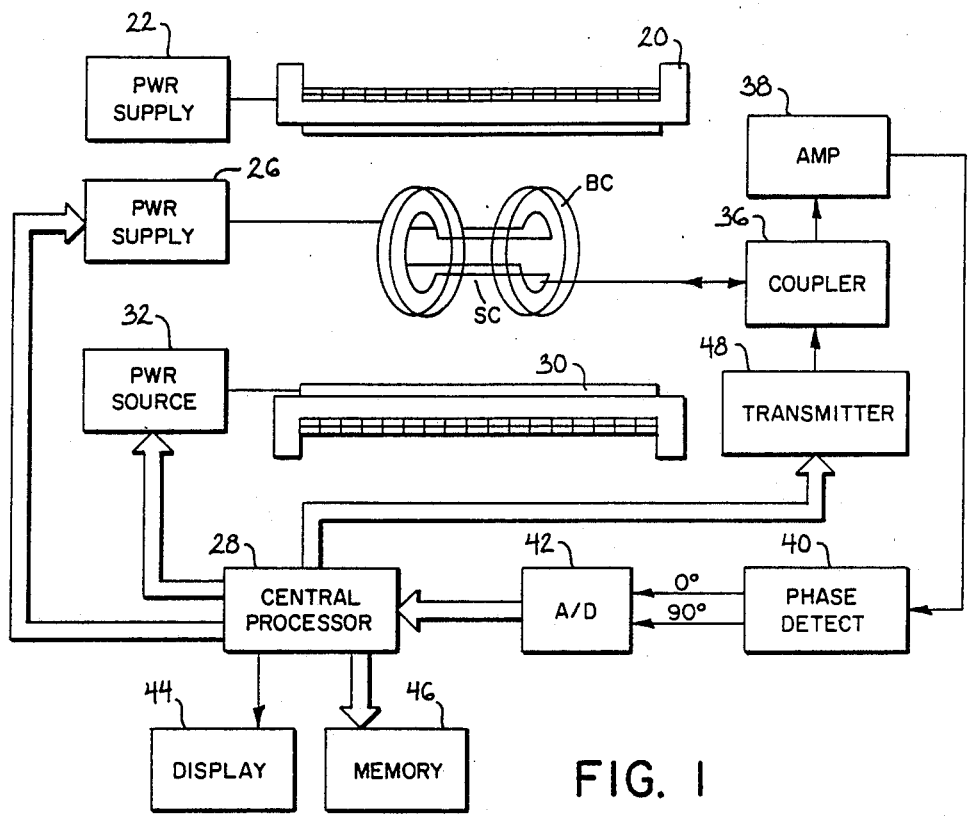
Figure 5:
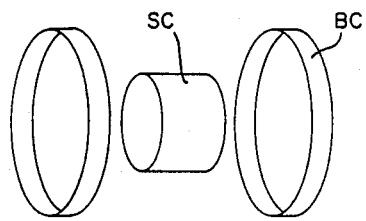

Benefits of the invention are most evident in cases where a target area to be examined is just a limited section of an object to be examined. Thus, when examining e.g. a human head, a set of coils producing magnetic field Bp can be relatively compact and simple (e.g. set of Helmholz coils) and the required electric power is low (e.g. for a 0.05T field having a diameter of circa 400 mm power is circa 1kW). The magnet for generating magnetic field Bo can be a solenoid, which can accommodate a person to be examined and which produces a field that fulfils the requirements of imaging methods e.g. in terms of stability and homogeneity. The set of signal coils may comprise a simple saddle coil, a more sophisticated quadrature coil or a so-called "wave wound" coil described in reference Savolainen: U.S. Pat. No. 4 654 596. This application is shown in FIG. 5.

Figures 6A, 6B:
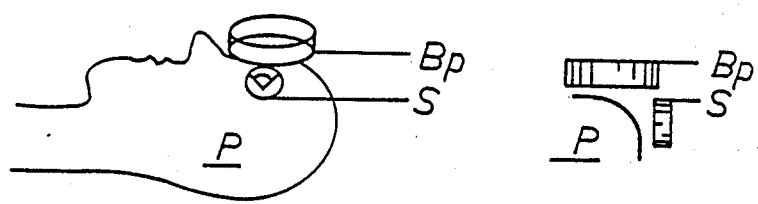
FIGS. 6A and 6B show a coil assembly suitable e.g. for the examination of the eye of a person P. Both the signal coil SC and the coils BC producing magnetic field Bp are solenoids which are orthogonal to each other.
Figures 7A, 7B:
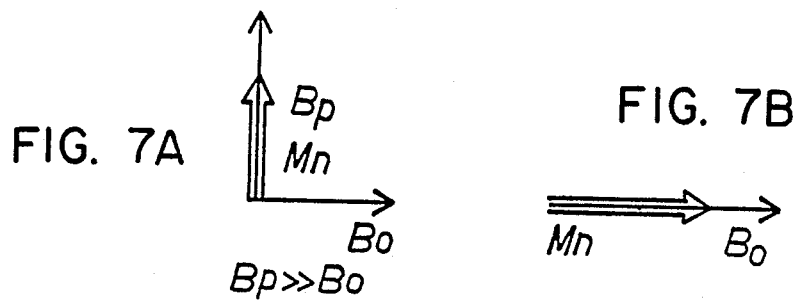
FIG. 7A depicts the behavior of nuclear magnetization in a situation wherein magnetic fields Bo and Bp are orthogonal to each other and Bp>>Bo.
FIG. 7B shows a situation following the switching off of magnetic field Bp, wherein the nuclear magnetization Mn produced during the combined action of magnetic fields Bo and Bp has adiabatically reversed into the direction of magnetic field Bo.

In such cases as imaging the eye, ear or maxillary joint, Bp can be created by means of a small coil and a relatively large magnetic field can be generated with relatively low power and Bp can be set to be orthogonal (or in some other position) relative to Bo field. The intensity of forming nuclear magnetization is in this case dictated by magnetic field Bp and when magnetic field Bp is eliminated, the produced magnetization turns into the direction of Bo and can then be applied to resonance tests. This type of technique is illustrated in FIG. 6 showing a technique for the examination of a human eye and FIG. 7 depicts various phases in the behavior of nuclear magnetization when magnetic field Bp is switched on and immediately after the switching off of field Bp.

A coil producing the magnetic field Bp can also serve as a coil for excitation of the nuclear spin system and a coil for detection of the resulting NMR signal. This type of technique of the invention is illustrated in FIG. 8. A power supply 26 is controlled by central processor 28 and supplies current via the safety and anti-noise circuits built by diodes D and coils L1, L2, L3 as well as capacitors C2, C3 to a coil SB which generates magnetic field Bp. SB serves also as an excitation coil under the control of a transmitter 48 coupled via capacitor C and signal amplifier 50 is coupled via C4 and C5 to receive a resonance signal. The excitation and amplification systems for equipment based on the nuclear magnetic resonance phenomenon are described e.g. in reference Hoult: Prog. in NMR Spectroscopy, vol. 12, p. 41-77, 1978.

The above description only deals with some of the possible applications of the invention. The invention can be applied e.g. in connection with methods intended for mapping the inhomogeneities of a chemical displacement or a magnetic field. Such methods are set forth e.g. in references Savolainen et al: FI Patent No. 65859 and Sepponen: U.S. Pat. No. 4 654 595, Brown et al: Proc. Natl. Acad. Sci. (USA), vol. 79, p. 3523-3526, 1982, Burl et al: GB 2 057 142.

The invention can also be applied in connection with methods using a so-called spin echo for mapping the nuclear magnetic parameters of an object, for the mapping of flow. In addition, it is possible to utilize so-called Driven Equilibrium methods for increasing the signal-to-noise ratio.

I claim:

1. Apparatus for examining an object by means of nuclear magnetic resonance based techniques, including magnetic resonance imaging, said apparatus providing an improved signal-to-noise ratio and comprising:
    means for generating a first polarizing magnetic field and for applying same to the object undergoing examination;
    means for generating magnetic field gradients for said first polarizing magnetic field;
    means for generating a second polarizing magnetic field for application to said object;
    means for exciting the nuclear spin system of said object and detecting the resulting nuclear magnetic resonance signal; and
    means controlling the operation of said magnetic field gradients generating means, said exciting and detecting means, and said second polarizing magnetic field generating means for applying said second polarizing magnetic field to said object prior to but not during nuclear spin system excitation, magnetic field gradient generation, and nuclear magnetic resonance signal detection.

2. The apparatus according to claim 1 wherein said means for generating said first and second polarizing magnetic fields are further defined as generating said fields parallel to each other.

3. The apparatus according to claim 1 wherein said means for generating said first and second polarizing magnetic fields are further defined as generating said fields non-parallel to each other.

4. The apparatus according to claim 1 wherein said means for generating said second polarizing magnetic field comprises an electromagnetic coil.

5. The apparatus according to claim 1 wherein said means for generating said first polarizing magnetic field comprises one of an electromagnetic coil and a permanent magnet, the homogeneity and stability of said first polarizing magnetic field generating means being selected in accordanced with the nuclear magnetic resonance technique employed for examination.

6. The apparatus according to claim 1 wherein said second polarizing magnetic field generating means and said exciting and detecting means contain a common element.

7. The apparatus according to claim 1 wherein said means for generating said first and second polarizing magnetic fields are further defined as generating magnetic fields producing a resultant magnetic field in said object having a predetermined value at which nuclear relaxation events in said object are desirably examined.

8. A method for examining an object by means of nuclear magnetic resonance based techniques, including magnetic resonance imaging, said method providing an improved signal-to-noise ratio and comprising the steps of:
    generating a first polarizing magnetic field and applying same to the object undergoing examination;
    generating magnetic field gradients for the first polarizing magnetic field;
    generating a second polarizing magnetic field for application to said object;
    exciting the nuclear spin system of said object and detecting the resulting nuclear magnetic resonance signal; and
    controlling the generation of the magnetic field gradients, the excitation of the nuclear spin system and detection of the resulting nuclear magnetic resonance signal, and the generation of the second polarizing magnetic field for applying the second polarizing magnetic field to said object prior to but not during nuclear spin system excitation, magnetic field gradient generation, and nuclear magnetic resonance signal detection.

9. The method according to claim 8 wherein the steps of generating the first and second polarizing magnetic fields are further defined as generating the fields parallel to each other.

10. The method according to claim 8 wherein the steps generating the first and second polarizing magnetic fields are further defined as generating the fields non-parallel to each other.

11. The method according to claim 8 wherein the step of generating the second polarizing magnetic field is further defined as generating the field by means of an electromagnetic coil.

12. The method according to claim 8 wherein the step of generating the first polarizing magnetic field is further defined as generating the field by means of one of an electromagnetic coil and a permanent magnet, and as selecting the homogeneity and stability of the means used to generate the first polarizing magnetic field in accordance with the nuclear magnetic resonance technique employed for examination.

13. The method according to claim 8 further defined as employing a common element to generate the second polarizing magnetic field, excite the nuclear spin system and detect the resulting nuclear magnetic resonance signal.

14. The method according to claim 8 further defined as generating first and second polarizing magnetic fields producing a resultant magnetic field in said object having a predetermined value at which nuclear relaxation events in said object are desirably examined.

* * * * *